United States Patent [19]

Shimogawa

[11] Patent Number: 5,157,631
[45] Date of Patent: Oct. 20, 1992

[54] RANDOM ACCESS MEMORY DEVICE WITH DUAL CHARGING CIRCUITS DIFFERENT IN CURRENT DRIVING CAPABILITY

[75] Inventor: Kenjyu Shimogawa, Tokyo, Japan
[73] Assignee: NEC Corporation, Tokyo, Japan
[21] Appl. No.: 673,914
[22] Filed: Mar. 25, 1991
[30] Foreign Application Priority Data
  Mar. 27, 1990 [JP] Japan .................................. 2-78127
[51] Int. Cl.⁵ .............................................. G11C 7/00
[52] U.S. Cl. .................................... 365/203; 365/202; 365/208; 365/189.06
[58] Field of Search ............... 365/202, 203, 207, 208, 365/189.06

[56] References Cited

U.S. PATENT DOCUMENTS 4,852,064 7/1989 Kim et al. ........................... 365/203
5,236,492 7/1991 Runaldue ............................ 365/203

Primary Examiner—Joseph E. Clawson, Jr.
Attorney, Agent, or Firm—Sughrue, Mion, Zinn, Macpeak & Seas

[57] ABSTRACT

For decreasing current consumption, a random access memory device comprises a plurality of static memory cells arranged in matrix, a plurality of digit line pairs respectively coupled to the columns of the memory cells for propagating data bits to a column selector unit, and a set of high-impedance and low-impedance current charging circuits coupled to each of the bit line pairs, in which the low-impedance current charging circuit supplies current to one of the bit line pairs selected by the column selector unit and the other non-selected bit line pairs are supplied from the associated high-impedance current charging circuits.

7 Claims, 4 Drawing Sheets

RANDOM ACCESS MEMORY DEVICE WITH DUAL CHARGING CIRCUITS DIFFERENT IN CURRENT DRIVING CAPABILITY

FIELD OF THE INVENTION

This invention relates to a semiconductor memory device and, more particularly, to the charging circuits coupled to digit line pairs incorporated in a static type random access memory device.

DESCRIPTION OF THE RELATED ART

A typical example of the random access memory device shown in FIG. 1 comprises four memory cell blocks each having 65536 memory cells A11, A12, A21, A22, A1281, A1282, .... arranged in matrix, and every memory cell of the memory cell block 1 is labeled as "Aij" where each of "i" and "j" is a natural number from 1 to 256. 128 word lines W1, W2, ... and W128 are respectively coupled to the rows of the memory cells of the block 1, and 128 digit line pairs DLP1, DLP2, .... are coupled to the columns of the memory cells, respectively. Each digit line pair consists of a true digit line D1 and a complementary digit line D2, and a charging circuit 2 is coupled to the true and complementary digit lines D1 and D2 for providing current through p-channel type load transistors QL11, QR11, QL12, QR12, .... The digit line pairs DLP1, DLP2, ..... are further coupled to a column selector unit 3, and the column selector unit 3 has p-channel type transfer gate transistors QL21, QR21, QL22, QR22, .... respectively coupled to the digit lines D1 and D2 and n-channel type balancing transistors QE1 and QE2 coupled between the true and complementary digit lines D1 and D2 of the associated digit line pair. A pair of read-out data lines RD1 and RD2 are coupled to the column selector unit 3, and a sense amplifier circuit SA1 is coupled to the read-out data lines RD1 and RD2 in association with the memory cell block 1.

Each of the memory cells A11, A12, A21, A22, A1281, A1282, ... comprises two series combinations of resistor elements RL1 and RR1 and n-channel type retaining transistors FL1 and FL2 coupled in parallel between the source of power voltage level Vcc and a ground node, and two n-channel type switching transistors TL1 and TR1 coupled between the true and complementary digit lines D1 and D2 of the associated digit line pair and the drain nodes of the retaining transistors FL1 and FR1. The switching transistors TL1 and TR1 are gated by the associated word line W1 and concurrently turn on upon elevation in voltage level on the associated word line W1.

The circuit behavior of the prior art random access memory device is briefly described hereinbelow. Prior to access to a memory cell, all of the word lines W1 to W128 remain in an inactive low voltage level, and all of the column selecting signals CL1, CL2, .... have been recovered to an inactive high voltage level. Only the balancing transistors QE1, QE2, ... are turned on, and all of the true digit lines D1 are balanced with the complementary digit lines D2.

Upon access to the memory cell A11 by way of example, the column selecting signal CL1 goes down to an active low voltage level. The balancing transistor QE1 turns off to isolate the true and complementary digit lines D1 and D2 from one another, and the transfer gate transistors QL21 and QR21 turn on to couple the digit line pair DLP1 to the read-out data lines RD1 and RD2. However, the other column selecting signals CL2, ... remain in the inactive high voltage level so that the read-out data lines RD1 and RD2 are isolated from the other digit line pairs DLP2, ..... Subsequently, the word line W1 goes up to the active high voltage level, and, accordingly, all of the switching transistors TL1 and TR1 coupled to the word line W1 turn on to provide current paths between the associated digit line pairs DLP1, DLP2, .... and the drain nodes of the retaining transistors FL1 and FR1. Then, current flows from the associated digit line pairs DLP1, DLP2, ... into the memory cells A11, A12, ...., and small differences in voltage level take place on the digit line pairs DLP1, DLP2, .... However, only the small difference on the digit line pair DLP1 is transferred through the column selector unit 3 to the read-out data lines RD1 and RD2. The associated sense amplifier circuit SA1 is, then, activated and increases the small difference on the read-out data lines RD1 and RD2. The difference voltage on the read-out data lines RD1 and RD2 are supplied to an output buffer unit (not shown), and an output data signal is delivered from the output buffer unit.

A problem is encountered in the prior art random access memory device in that a large amount of current is consumed by non-accessed memory cells coupled to the activated word line. Each of the load transistors QL11, QR11, QL12, QR12, ... incorporated in the charging circuit 2 has a gate width Wch of 40 microns and a gate length Lch of 1.3 microns, and each of the switching transistors TL1 and TR1 is designed to be 3 microns in gate width Wsw and 1.8 microns in gate length Lsw. The impedances of the load transistor QL11, ... and the switching transistor TL1 or TR1 are about 1 kilo-ohm and about 24 kilo-ohms, respectively. Since the power voltage level Vcc is about 5 volts, the amount of current Ic flowing into each non-accessed memory cell coupled to the activated word line is given by Equation 1.

$$Ic = 5 \text{ volts}/(1+24) \text{ kilo-ohms} = 200 \text{ micro-ampere} \quad \text{Equation 1}$$

Thus, each non-accessed memory cell coupled to the activated word line consumes about 200 micro-ampere. Since, each word line are shared by 128 memory cells of the memory cell block to be selected, the total amount of current Ic(total) consumed is as large as 25.6 milliamperes.

If the memory cells are grouped into more than four memory cell blocks, the number of the memory cells coupled to the word line is decreased, and the amount of current to be consumed by the non-accessed memory cells is, accordingly, reduced. However, a large number of memory cell blocks needs a large decoder unit, and the component transistors of the large decoder unit occupy a substantial amount of real estate of the semiconductor chip. For this reason, another approach is necessary for solving the problem inherent in the prior art read only memory device.

SUMMARY OF THE INVENTION

It is therefore an important object of the present invention to provide a random access memory device non-accessed memory cells of which consume a small amount of current upon access without increase of the number of memory cell blocks.

To accomplish the object, the present invention proposes to supply current through either high impedance or low impedance charging circuit to a digit line pair depending upon a column selecting signal.

In accordance with the present invention, there is provided a semiconductor memory device comprising: a) a plurality of memory cells arranged in rows and columns and respectively storing data bits; b) a plurality of word lines respectively coupled to the rows of the memory cells and allowing the data bits to be read out from one of the rows of the memory cells; c) a plurality of digit line pairs coupled to the columns of the memory cells, respectively, and propagating the data bits read out from the memory cells; d) a column selector unit responsive to a multi-bit column selecting signal for relaying one of the data bits on the plurality of digit line pairs to a read-out data bus; e) a plurality of first charging circuits respectively coupled to the digit line pairs and supplying current to the associated digit line pairs when the column selector unit does not select the associated digit line pairs, each of the first charging circuits having a relatively high impedance against electric current; and f) a plurality of second charging circuits respectively coupled to the digit line pairs, one of the second charging circuits supplying current to the associated digit line pair when the column selector unit selects, each of the second charging circuits having a relatively low impedance against electric current, in which each first charging circuit and each second charging circuit are responsive to one of the bits of the multi-bit column selecting signal so as to be complementarily shifted between active and inactive states.

BRIEF DESCRIPTION OF THE DRAWINGS

The features and advantages of a random access memory device according to the present invention will be more clearly understood from the following description taken in conjunction with the accompanying drawings in which.

DESCRIPTION OF THE PREFERRED EMBODIMENTS

First Embodiment

Figure 1:
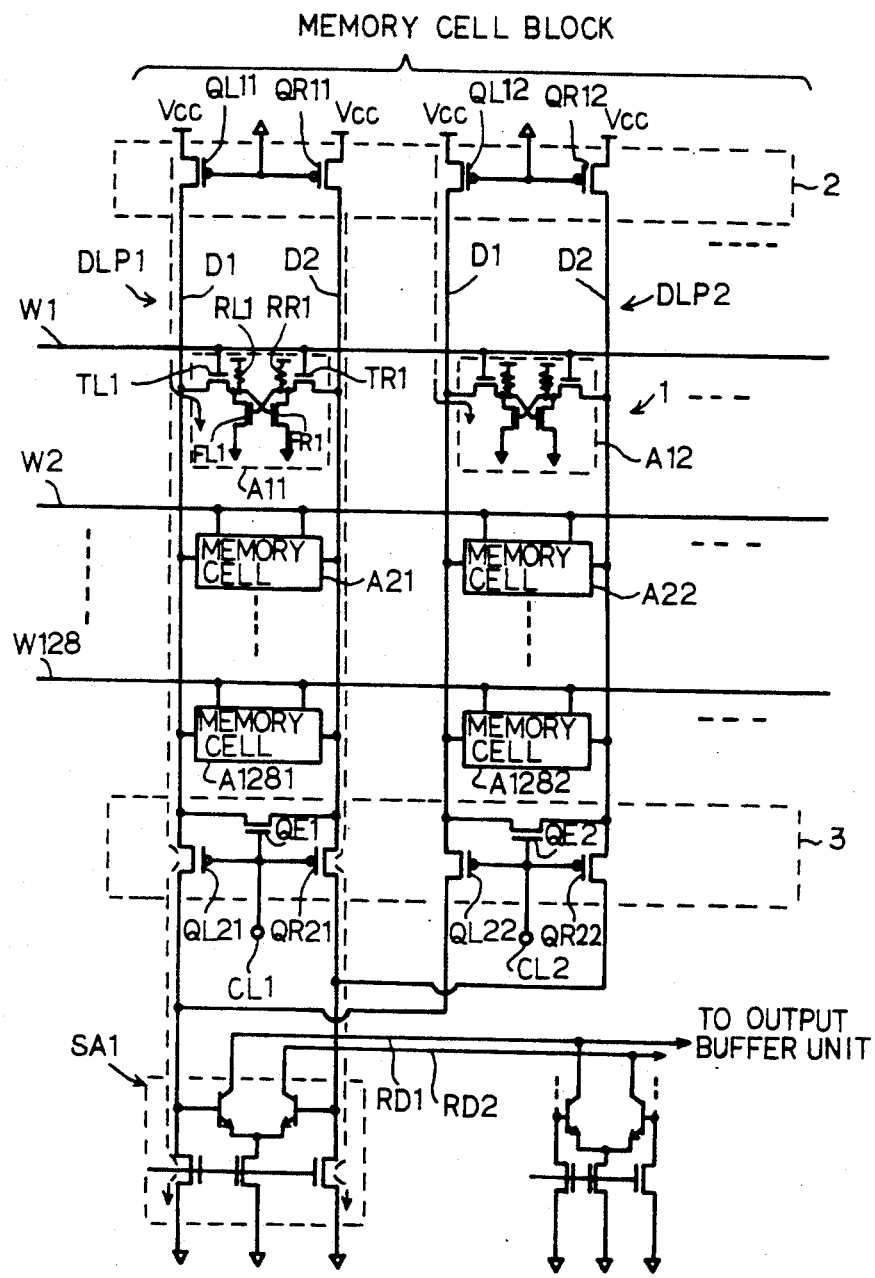
FIG. 1 is a circuit diagram showing the arrangement of a prior art random access memory device.
Figure 2:
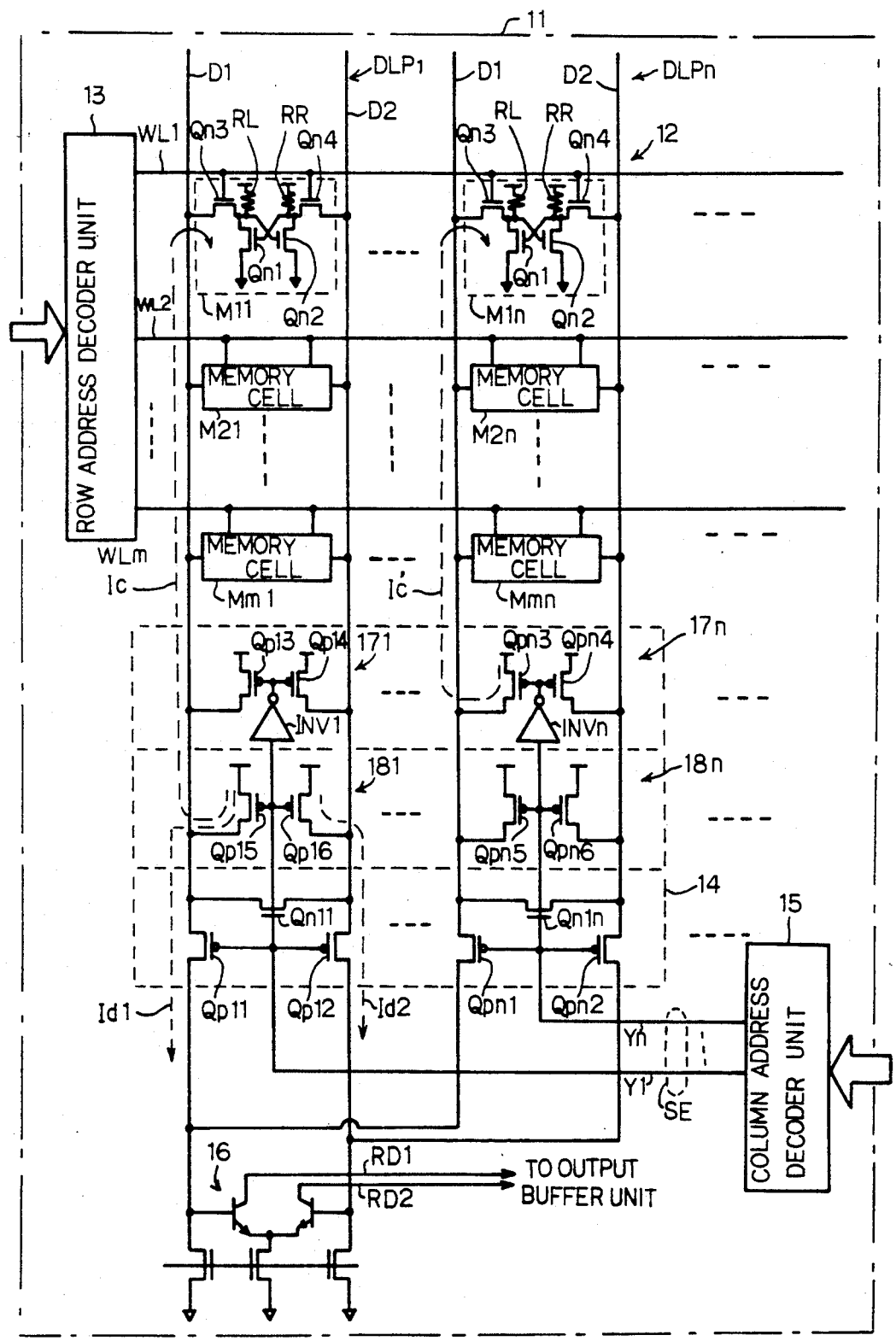
FIG. 2 is a circuit diagram showing the arrangement of a random access memory device according to the present invention.

Referring to FIG. 2 of the drawings, a static type random access memory device embodying the present invention is fabricated on a single semiconductor chip 11 and comprises a plurality of memory blocks only one of which is illustrated and designated by reference numeral 12. The number of the memory blocks is four in so far as the total number of the memory cells are equal to that of the prior art random access memory device.

The memory block 11 comprises a plurality of memory cells M11, M1n, M21, M2n, Mm1 and Mmn arranged in rows and columns, and each of the memory cells M11 to Mmn is of the static type. The memory block 12 is associated with a plurality of word lines WL1, WL2, ... and WLm, and the word lines WL1 to WLm are respectively coupled to the rows of the memory cells M11 to Mmn. A plurality of digit line pairs DLP1 to DLPn are further associated with the memory block 12, and the digit line pairs DLP1 to DLPn are respectively coupled to the columns of the memory cells M11 to Mmn. Each of the digit line pairs DLP1 to DLPn consists of a true digit line D1 and a complementary digit line D2.

Each memory cell comprises two series combination of resistor elements RL and RR and n-channel enhancement type retaining transistors Qn1 and Qn2 coupled in parallel between a source of positive voltage level and a ground node, and two n-channel enhancement type switching transistors Qn3 and Qn4 coupled between the true and complementary digit lines D1 and D2 of the associated digit line pair and the drain nodes of the retaining transistors Qn1 and Qn2. The switching transistors Qn3 and Qn4 are gated by the associated word line WL1, WL2 or WLm, and a row address decoder unit 13 shifts one of the word lines WL1 to WLm to an active high voltage level. When the word line WL1, WL2 or WLm goes up to the active high voltage level, the switching transistors Qn3 and Qn4 of all the memory cells coupled thereto simultaneously provide current paths respectively from the digit line pairs DLP1 to DLPn. In FIG. 2, the source of positive voltage level is represented by a short lateral bar, and small triangles stand for the ground node. In this instance, the source of positive voltage level produces about 5 volts.

A column selector unit 14 is coupled between the digit line pairs DLP1 to DLPn and a pair of read-out data lines RD1 and RD2 and interconnects one of the digit line pairs DLP1 to DLPn and the read-out data lines RD1 and RD2 under the control of a column address decoder unit 15. Namely, the column address decoder unit 15 is responsive to a column address signal and produces a multi-bit column selecting signal SE only one component bit of which is shifted to an active low voltage level, leaving the other component bits in an inactive high voltage level. The column selector unit 14 has p-channel enhancement type transfer gate transistors Qp11, Qp12, Qpn1 and Qpn2, and only one pair of the p-channel enhancement type transfer gate transistors Qp11 and Qp12 or Qpn1 and Qpn2 turn on with the multi-bit column selecting signal SE. The column selector unit 14 further comprises a plurality of n-channel enhancement type balancing transistors Qn11 to Qn1n, and the balancing transistors Qn11 to Qn1n are gated by the multi-bit column selecting signal SE. While the component bits Y1 to Yn of the multi-bit column selecting signal SE remain in the high voltage level, the n-channel enhancement type balancing transistors Qn11 to Qn1n turn on and equalize the voltage levels of the associated digit line pairs DLP1 to DLPn. A sense amplifier circuit 16 is coupled to the read-out data lines RD1 and RD2. However, no further description on the sense amplifier circuit 16 is incorporated, because the sense amplifier circuit 16 is not directly related to the gist of the present invention.

The digit line pairs DLP1 to DLPn are further coupled to a plurality of first charging circuits 171 to 17n, and each of the first charging circuits 171 to 17n comprises an inverter circuit INV1 or INVn and a pair of p-channel enhancement type charging transistors Qp13 and Qp14 or Qpn3 and Qpn4. The multi-bit column selecting signal SE is supplied to the inverter circuits INV1 to INVn, and the p-channel enhancement type charging transistors Qp13, Qp14, Qpn3 and Qpn4 are gated by the associated inverter circuits INV1 to INVn, respectively. The p-channel enhancement type charging transistors Qp13, Qp14, Qpn3 and Qpn4 are coupled between the source of positive voltage level and the true and complementary digit lines D1 and D2, respectively, and the p-channel enhancement type charging transistors Qp13 to Qpn4 produce a relatively high impedance or a high resistance against current from the source of positive voltage level to the associated digit lines D1 and D2. In this instance, each of the n-channel enhancement charging transistors Qp13 to Qpn4 is about 3 micron in gate width and about 1.8 microns in gate length, and the resistance thereof is of the order of 24 kilo-ohms in the on-state.

A plurality of second charging circuits 181 to 18n are respectively coupled to the digit line pairs DLP1 to DLPn, and each of the second charging circuits 181 to 18n comprises a pair of p-channel enhancement type charging transistors Qp15 and Qp16 or Qpn5 and Qpn6 coupled between the source of positive voltage level and the associated true and complementary digit lines D1 and D2, respectively. The multi-bit column selecting signal SE is supplied to the second charging circuits 181 to 18n, and the p-channel enhancement type charging transistors Qp15 to Qpn6 produce a relatively low impedance or a low resistance against current from the source of positive voltage level to the associated true and complementary digit lines D1 and D2. In this instance, each of the n-channel enhancement type charging transistors Qp15 to Qpn6 is about 40 microns in gate width and about 1.3 microns in gate length, and the resistance thereof is of the order of 1 kilo-ohm in the on-state.

Description is hereinbelow made on the circuit behavior of the random access memory device according to the present invention. While the random access memory device is in the standby mode, the component bits Y1 to Yn of the column selecting signal SE of the inactive high voltage level allow the high-impedance first charging circuits 171 to 17n to charge the associated digit line pairs DLP1 to DLPn, and all of the n-channel enhancement type balancing transistors Qn11 to Qn1n are turned on so that the true and complementary digit lines D1 and D2 of the digit line pairs DLP1 to DLPn are well balanced with one another. Assuming now that the data bit stored in the memory cell M11 is accessed time t1, the random access memory device enters a data access mode, and the word line WL1 and the component bit Y1 of the multi-bit column selecting signal SE are driven to the respective active voltage levels. In detail, when the component bit Y1 goes down to the active low voltage level, the p-channel enhancement type transfer gate transistors Qp11 and Qp12 as well as the p-channel enhancement type charging transistors Qp15 and Qp16 turn on, but the inverter circuit INV1 causes the p-channel enhancement type charging transistors Qp13 and Qp14 to be turned off. Then, the digit line pair DLP1 is charged through the low-impedance second charging circuit 181 and coupled to the read-out data lines RD1 and RD2. Since the word line WL1 causes the n-channel enhancement type switching transistors Qn3 and Qn4 of the memory cell M11, a small difference voltage rapidly takes place through the retaining transistors Qn1 and Qn2 depending upon the data bit stored in the memory cell M11 and is relayed to the sense amplifier circuit 16. The large current driving capability of the second charging circuit 181 promotes the rapid data propagation to the sense amplifier circuit 16. The amount of current Ic flowing into the memory cell M11 is as large as the charging circuit incorporated in the prior art random access memory device and, accordingly, about 200 microampere.

However, since the other component bits Yn of the multi-bit column selecting signal SE remain in the inactive high voltage level, the other n-channel enhancement type balancing transistors Qn1n remain in the on-state, and the p-channel enhancement transfer ate transistors Qpn1 and Qpn2 are turned off. With the component bits Yn of the inactive high voltage level, the low-impedance second charging circuits 18n are not activated, but the inverter circuits INVn activate the associated high-impedance first charging circuits 17n. Since the word line WL1 further allows the n-channel enhancement type switching transistors Qn3 and Qn4 of the other memory cells M12 to M1n to turn on, the first charging circuits 17n supply current to the other memory cells so as to keep the data bits stored therein. However, the current is consumed only for maintaining the data bits, and the small current driving capability of each first charging circuit 17n is preferable in view of current consumption. In this instance, the amount of current Ic' flowing into the memory cell M1n is given by Equation 2

$$Ic' = 5 \text{ volts}/(24+24) \text{ kilo-ohms} = 104 \text{ micro-ampere} \quad \text{Equation 2}$$

Thus, each of the non-accessed memory cells M12 to M1n coupled to the activated word line WL1 is a half of that of the prior art random access memory device. Since the current consumption of the non-accessed memory cells M12 to M1n is decreased by (n−1) times of the difference between (200−104) micro-ampere, the random access memory device according to the present invention is improved in the current consumption.

Figure 3:
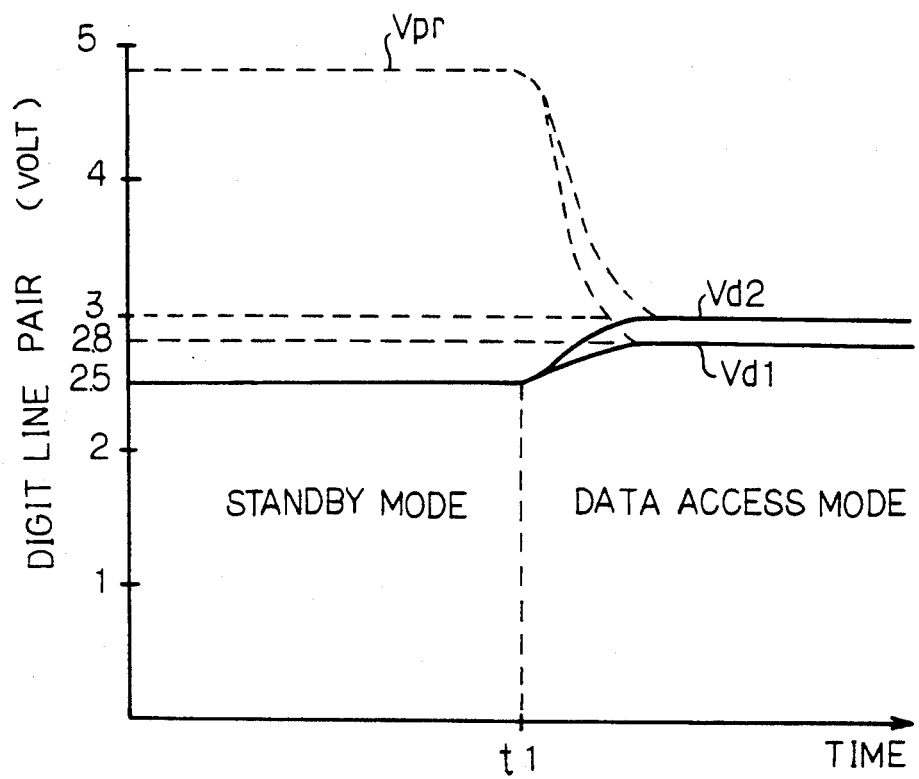
FIG. 3 is a graph showing the voltage levels on the digit line pair incorporated in the random access memory device shown in FIG. 2.

Subsequently, the voltage levels on the digit line pair DLP1 are hereinbelow described with reference to FIG. 3. Upon selecting the digit line pair DLP1, the second charging circuit 181 supplies not only the current Ic but also current Id1 and Id2, and the current Id1 and Id2 are used for the sense amplifier circuit 16. The current Id1 or Id2 is estimated at about 2 milliamperes. The voltage level Vd1 on the true digit line D1 is dominated by the amount of current passing through the p-channel enhancement type charging transistor Qp15 and given by Equation 3.

$$Vd1 = 5 \text{ volts} - (200 \text{ micro-ampere} + 2 \text{ milliamperes}) \times 1 \text{ kilo-ohm} = 2.8 \text{ volts} \quad \text{Equation 3}$$

On the other hand, the voltage level Vd2 on the complementary digit line D2 is dominated by the amount of current passing through the p-channel enhancement type charging transistor Qp16 and calculated as $$Vd2 = 5 \text{ volts} - 2 \text{ milliampere} \times 1 \text{ kilo-ohm} = 3.0 \text{ volts} \quad \text{Equation 4}$$

The voltage levels Vd1 and Vd2 on the digit line pair DLP1 are propagated to the sense amplifier circuit 16, and the difference voltage level of about 0.2 volt is increased so as to produce an output data signal.

The voltage levels Vd' on eh true and complementary digit lines D1 and D2 of the digit line pair DLPn are clamped at 2.5 volts, because the true and complementary digit lines D1 and D2 are charged by the high-impedance first charging circuits 171 to 17n and equalized through the associated balancing transistors Qn1n. The voltage level VD' is calculated as $$Vd' = 5 \text{ volts} - 104 \text{ micro-ampere} \times 24 \text{ kilo-ohm} = 2.5 \text{ volts}$$

Equation 5

Although the voltage level Vd' is lower than the corresponding voltage level Vpr of the prior art, which is as high as 4.8 volts, the voltage level Vd' is high enough to keep the data bit, because the voltage level Vd' is higher than the threshold voltage level of the n-channel enhancement type retaining transistors Qn1 and Qn2.

Second Embodiment

Figure 4:
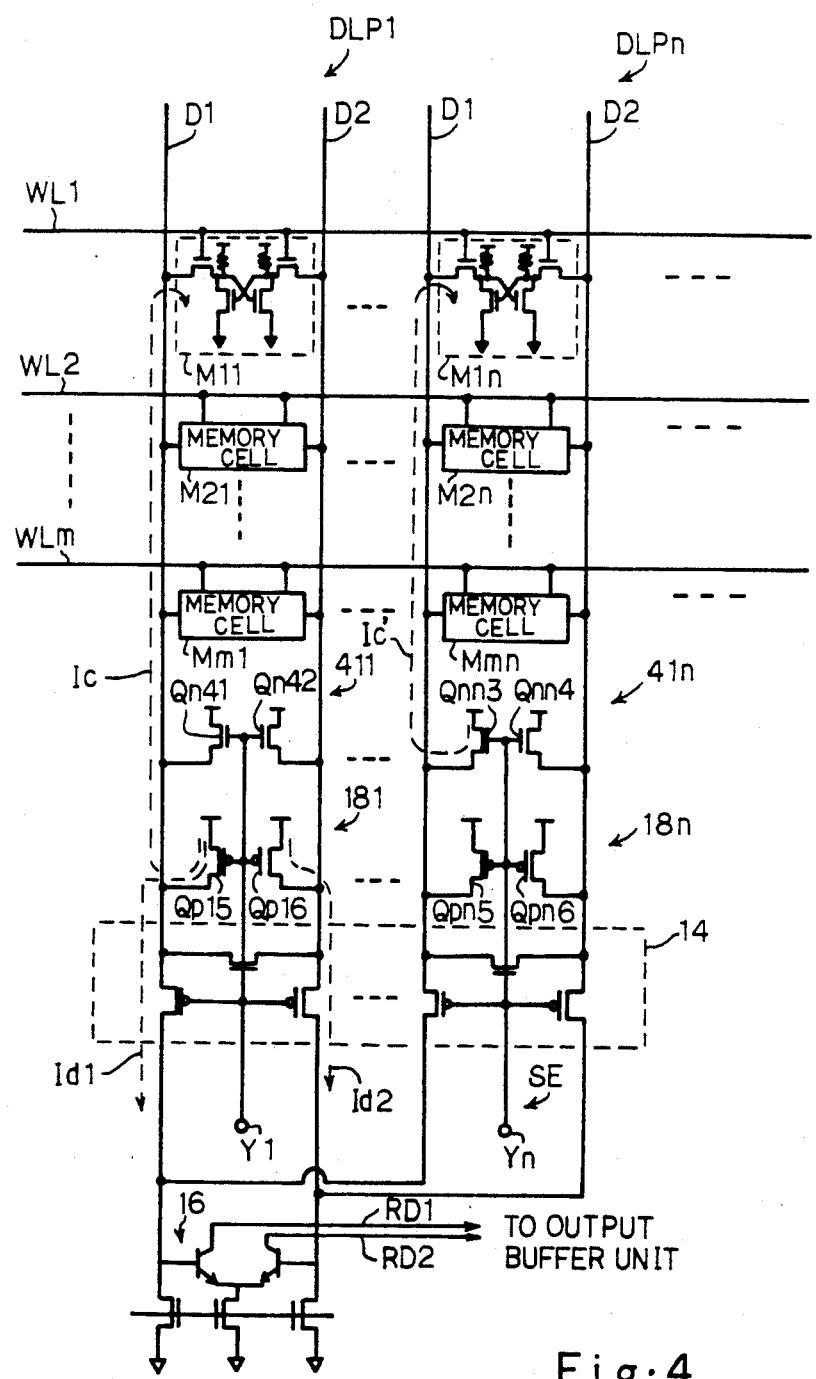
FIG. 4 is a circuit diagram showing the arrangement of another random access memory device according to the present invention.

Turning to FIG. 4 of the drawings, another random access memory device embodying the present invention is illustrated. The random access memory device shown in FIG. 4 is similar to the first embodiment except for first charging circuits 411 to 41n, and, for this reason, the other component circuits and transistors are designated by the same references used in FIG. 2 without any detailed description.

Each of the first charging circuits 411 to 41n is fabricated from n-channel enhancement type charging transistors Qn41 and Qn42 or Qnn3 and Qnn4 coupled in parallel between the source of positive voltage level and the associated digit line pair DLP1 or DLPn. The n-channel enhancement type charging transistors Qn41 to Qnn4 are as high in impedance against current as the p-channel enhancement type charging transistors Qp13 to Pqn4 of the first embodiment. The component bits Y1 to Yn of the column selecting signal SE are respectively supplied to the gate electrodes of the n-channel enhancement type charging transistors Qn41 to Qnn4. Since the second charging circuits 181 to 18n are fabricated from the p-channel enhancement type charging transistors Qp15 to Qpn6, one of the second charging circuits 181 to 18n charges the associated digit line pair DLP1 or DLPn in the presence of the component bit Y1 or Yn on the active low voltage level, however, the first charging circuits 411 to 41n charge the other non-selected digit line pairs DLPn with the component bits of the inactive high voltage level.

Thus, the first charging circuits 411 to 41n are fabricated without any inverter circuit, and the random access memory device shown in FIG. 4 is smaller in the number of component transistors than the first embodiment. However, the advantages of the present invention are also achieved by eh second embodiment. The circuit behavior of the second embodiment is similar to.tat of the first embodiment, and, therefore, description on the circuit behavior is deleted for the sake of simplicity.

Although particular embodiments of the present invention have been shown and described, it will be obvious to those skilled int eh art that various changes and modifications may be made without departing from the spirit and scope of the present invention. For example, the high-impedance first charging circuits may be implemented by a combination of a field effect transistor and a resistor.

What is claimed is;

1. A semiconductor memory device comprising:
   a) a plurality of memory cells arranged in rows and columns and respectively storing data bits;
   b) a plurality of work lines respectively coupled to the rows of the memory cells and allowing said data bits to be read out from one of said rows of said memory cells;
   c) a plurality of digit line pair coupled to the columns of said memory cells, respectively, and propagating said data bits read out from said memory cells, said data bits being in the form of differential voltages;
   d) a column selector unit responsive to a multi-bit column selecting signal for relaying one of said data bits on said plurality of digit line pairs to a read-out data bus;
   e) a plurality of first charging circuits respectively coupled to said digit line pairs and supplying current to said associated digit line pairs when said column selector unit does not select said associated digit line pairs, each of said first charging circuits having a relatively high impedance against electric current; and
   f) a plurality of second charging circuits respectively coupled to said digit line paris, one of said second charging circuits supplying current to said associated digit line pair when said column selector unit selects, each of said second charging circuits having a relatively low impedance against electric current, in which each first charging circuit and each second charging circuit are responsive to one of the bits of said multi-bit column selecting signal so that said each first charging circuit is complementarily shifted between active and inactive states with respect to said each second charging circuit, first charging circuits in said active state selected from said plurality of first charging circuits maintaining differential voltage levels indicative of said data bits, one of said second charging units in said active state maintaining a differential voltage indicative of said one of said data bits.

2. A random access memory device as set forth in claim 1, in which said memory cells are of a static type implemented by a flip-flop circuit coupled between first and second sources of voltage level.

3. A random access memory device as set forth in claim 2, in which each of said first charging circuits comprises first and second field effect transistors coupled between said first source of voltage level and said associated digit line pair, and an inverter circuit supplied with one of the component bits of said multi-bit column selecting signal for controlling said first and second field effect transistors, said first and second field effect transistors being of a first channel conductivity type operable in an enhancement mode.

4. A random access memory device as set forth in claim 3, in which each of said second charging circuits comprises third and fourth field effect transistors coupled between said first source of voltage level and said associated digit line pair and responsive to one of the component bits of said multi-bit column selecting signal, said third and fourth field effect transistors being of said first channel conductivity type operable in said enhancement mode.

5. A random access memory device as set forth in claim 4, in which each of said first and second field effect transistors produces a resistance of about 24 kilo-ohms, and in which each of said third and fourth field effect transistors produces a resistance of about 1 kilo-ohms.

6. A random access memory device as set forth in claim 2, in which each of said first charging circuits comprises fifth and sixth field effect transistors coupled between said first source of voltage level and said associated digit line pair and responsive to one of the component bits of said multi-bit column selecting signal, said fifth and sixth field effect transistors being of a second channel conductivity type operable in said enhancement mode.

7. A random access memory device as set forth in claim 6, in which each of said second charging circuits comprises seventh and eighth field effect transistors coupled between said first source of voltage level and said associated digit line pair and responsive to one of the component bits of said multi-bit column selecting signal, said seventh and eighth field effect transistors being of said first channel conductivity type operable in said enhancement mode.

* * * * *

UNITED STATES PATENT AND TRADEMARK OFFICE
CERTIFICATE OF CORRECTION

PATENT NO. : 5,157,631

DATED : October 20, 1992

INVENTOR(S) : Kanjyu Shimogawa

It is certified that error appears in the above-identified patent and that said Letters Patent is hereby corrected as shown below:

Col. 6, line 62, delete "eh" and insert --the--.

Col. 7, line 47, delete "eh" and insert --the--;

Col. 7, line 48, delete "tat" and insert --that--;

Col. 7, line 53, delete "int eh" and insert --in the.--

Col. 8, line 15, delete "paris" and insert --pairs--.

Signed and Sealed this

Ninth Day of November, 1993

Attest:

BRUCE LEHMAN

Attesting Officer

Commissioner of Patents and Trademarks